(12) United States Patent
Takenaka et al.

(10) Patent No.: US 6,268,645 B1
(45) Date of Patent: Jul. 31, 2001

(54) SEMICONDUCTOR DEVICE

(75) Inventors: Masashi Takenaka; Shiro Yoda; Junichiro Hiyoshi; Hiroshi Takahashi; Hideo Sato, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/532,774

(22) Filed: Mar. 22, 2000

(30) Foreign Application Priority Data

Apr. 16, 1999 (JP) .................................................. 11-109930

(51) Int. Cl.[7] .................................................. H01L 23/495
(52) U.S. Cl. .................. 257/668; 257/669; 257/671; 257/702; 257/787; 257/701
(58) Field of Search .................................. 257/668, 669, 257/671, 787, 701, 702

(56) References Cited

U.S. PATENT DOCUMENTS 5,949,134 * 9/1999 Yanagisawa ......................... 257/668
6,049,122 * 4/2000 Yoneda ................................ 257/668

FOREIGN PATENT DOCUMENTS

401293527 * 11/1989 (JP) ........................................... 21/60
402025048 * 1/1990 (JP) ........................................... 21/60
404072751 * 5/1992 (JP) ........................................... 23/50

* cited by examiner

*Primary Examiner*—Tom Thomas
*Assistant Examiner*—Netin Parekh
(74) *Attorney, Agent, or Firm*—Armstrong, Westerman, Hattori, McLeland & Naughton, LLP

(57) ABSTRACT

A semiconductor device having a semiconductor chip on a TAB (Tape Automated Bonding) tape with high reliability is provided. The semiconductor device of the present invention includes a TAB tape which has a base film provided with a device hole in a position where a semiconductor chip is mounted, a wiring pattern whose end portions constitute inner leads connected to the semiconductor chip and terminal connecting portions provided with solder balls, and a photo-solder resist which protects the wiring pattern. Chamfered portions which relieves internal residual stress caused in the photo-solder resist due to the difference in thermal expansion coefficient between the base film and the photo-solder resist are formed at locations on the photo-solder resist facing the corners of the device hole.

12 Claims, 11 Drawing Sheets

SEMICONDUCTOR DEVICE

BACKGROUND OF THE INVENTION

1. Field of the Invention

The present invention generally relates to semiconductor devices, and, more particularly, to a semiconductor device having a semiconductor chip on TAB (Tape Automated Bonding) tape.

In recent years, there has been an increasing demand for smaller semiconductor devices, as electronic devices have been becoming more and more efficient. In response to the trend, BGA (Ball Grid Array) type semiconductor devices are being widely used. Among the BGA type semiconductor devices, T-BGA type semiconductor devices each having a semiconductor chip attached onto TAB tape are becoming more and more popular, because the interval between the bumps can be shortened in a T-BGA type semiconductor device.

As higher reliability is also expected, semiconductor devices which can perform in a stable manner regardless of changes in ambient temperature are required.

2. Description of the Related Art

FIGS. 1 to 3 illustrate a conventional semiconductor device 1 which employs a TAB technique. More specifically, FIG. 1 is an enlarged plan view of a corner of a device hole 7 of the semiconductor device 1, FIG. 2 is a enlarged sectional view of a corner of the device hole 7 of the semiconductor device 1, and FIG. 3 is a plan view of the semiconductor device 1 prior to the severance of a TAB tape 3. For ease of explanation, an encapsulation resin 4 is not shown in FIGS. 1 and 3.

The semiconductor device 1 comprises a semiconductor chip 2, the TAB tape 3, and the encapsulation resin 4. Circuits are formed on the upper surface of the semiconductor chip 2, and a plurality of electrodes 5 surround the circuits.

The TAB tape 3 comprises a base film 6, a wiring pattern 8, a solder resist 11, and resin stoppers 12.

The base film 6 is a resin substrate made of polyimide, for instance, and is provided with a square opening that is the device hole 7. The wiring pattern 8 having a predetermined pattern is formed on the base film 6. The inner end portions of the wiring pattern 8 extend into the device hole 7 and constitute inner leads 9. The outer end portions of the wiring pattern 8 constitute terminal connection portions provided with solder balls 14 (shown in FIG. 3) as external connecting terminals.

The semiconductor chip 2 is bonded to the inner leads 9 extending into the device hole 7 by bumps 10, so that the semiconductor chip 2 is electrically connected to the inner leads 9 via the bumps 10, and is fixed within the device hole 7.

The resin stoppers 12 are formed on the base film 6, and are located at the four corners of the device hole 7. The resin stoppers 12 are formed at the same time as the formation of the wiring pattern 8, and are made of the same material as the wiring pattern 8. With the resin stoppers 12 formed at the four corners of the device hole 7, the encapsulation resin 4 can be prevented from excessively flowing out through the device hole 7 toward the back side.

The distance L1 between the semiconductor chip 2 and the base film 6 at each corner of the device hole 7 is longer than the distance L2 between the semiconductor chip 2 and the base film 6 at a location other than each corner of the device hole 7. If the encapsulation resin 4 is formed without the resin stoppers 12, the amount of resin flowing out through the gap between the semiconductor chip 2 and the base film 6 at the corners of the device hole 7 is much larger than the amount of resin flowing out through the gap at the other locations. As a result, excess resin 4A is formed as shown in FIG. 2.

To avoid such a situation, the resin stoppers 12 are formed at each corner of the device hole 7, so that the gap between the semiconductor chip 2 and the base film 6 at the corners of the device hole 7 is made almost as narrow as the gap at the other locations. Thus, the encapsulation resin 4 can be prevented from excessively flowing out through the device hole 7 toward the back side.

The solder resist 11 is further placed on the base film 6. Conventionally, the solder resist 11 is formed to surround the device hole 7. To obtain the solder resist 11, an ink-type resist is formed by a printing technique. In recent years, however, as higher-density semiconductor devices have been expected, photoresist materials on which minute processing can be performed have been used as the solder resist 11. The solder resist 11 made of a photoresist material will be hereinafter referred to as a photo-solder resist. This photo-solder resist 11 is made of an insulating resin (such as epoxy resin) which is harder than the base film 6. The photo-solder resist 11 covers the upper surface of the wiring pattern 8 so as to protect the wiring pattern 8. The photo-solder resist 11 also covers a part of the resin stoppers 12.

The photo-solder resist 11 is not formed at the inner leads 9 and at the terminal connecting portions provided with the solder balls 14. Accordingly, the inner leads 9 and the terminal connecting portions are exposed through the photo-solder resist 11.

As mentioned before, the photo-solder resist 11 is made of a resin different from the base film 6 so as to provide the protection for the wiring pattern 8 and to maintain insulation properties. Therefore, the thermal expansion coefficient of the photo-solder resist 11 differs from the thermal expansion coefficient of the base film 6.

The encapsulation resin 4 is formed to cover the device hole 7, as shown in FIG. 2, so that it can protect the semiconductor chip 2 and the inner leads 9.

The semiconductor device 1 is heated, when the encapsulation resin 4 is formed after the semiconductor chip 2 is bonded to the TAB tape 3, and when the semiconductor device 1 is mounted on a printed circuit board. As a result, thermal expansion due to rapid temperature rise is induced, and stress is caused in the TAB tape 3 due to the difference in thermal expansion coefficient between the photo-solder resist 11 and the base film 6.

Since the photo-solder resist 11 is subjected to a photo-hardening process, it is harder than the conventional resist formed by a printing technique. Furthermore, the photo-solder resist 11 is also harder than the base film 6. Because of this, stress is caused mainly in the photo-solder resist 11. Also, stress tends to concentrate at locations where there is large variation in sectional area. Accordingly, in the photo-solder resist 11 having a rectangular frame-like shape, stress concentrates at locations facing the corners of the device hole 7.

For the above reasons, the conventional semiconductor device 1 has a problem that cracks occur at the locations on the photo-solder resist 11 facing the corners of the device hole 7 at the time of heat application. If the cracks grow larger, the wiring pattern 8 might be cut off by them, resulting in poor reliability of the semiconductor device 1.

SUMMARY OF THE INVENTION

A general object of the present invention is to provide semiconductor devices, in which the above disadvantages are eliminated.

A more specific object of the present invention is to provide a highly reliable semiconductor device, in which no cracking occurs.

The above objects of the present invention are achieved by a semiconductor device comprising:

a semiconductor chip;

a tape-type substrate which has a base film provided with a device hole formed in a location where the semiconductor chip is mounted, a wiring pattern whose end portions constitute inner leads connected to the semiconductor chip and terminal connecting portions provided with external connecting terminals, and a resist which has a thermal expansion coefficient different from that of the base film and is formed on the base film so as to protect the wiring pattern except the terminal connecting portions;

an encapsulation resin which covers the device hole including the semiconductor chip and a part of the resist; and stress relieving portions which are formed at locations on the resist facing the corners of the device hole, so as to relieve internal residual stress caused in the resist.

Since the stress relieving portions for relieving internal residual stress caused in the resist are formed at the locations on the resist facing the corners of the device hole, the stress caused due to the difference in thermal expansion coefficient between the resist and the base film can be prevented from concentrating at the corners of the device hole. More specifically, because of the difference in thermal expansion coefficient between the resist and the base film, stress is caused in the tape-type substrate when heat is applied to form the resin encapsulation or mount the semiconductor device. As the resist is generally harder than the base film, the stress is mostly caused in the resist. Also, the stress tends to concentrate in spots where the variation in sectional area is large. As a result, the stress concentrates particularly at the locations on the resist facing the corners of the device hole.

To solve this problem, the stress relieving portions for relieving the internal residual stress are formed at locations where the stress tends to concentrate, i.e., at the locations on the resist facing the corners of the device hole. With the stress relieving portions, cracking in the resist due to stress concentration can be prevented. Thus, the wiring pattern can be prevented from being cut off by a crack, and the reliability of the semiconductor device can be increased.

The above objects of the present invention are also achieved by a semiconductor device comprising:

a semiconductor chip;

a tape-type substrate which has a base film provided with a device hole formed in a location where the semiconductor chip is mounted, a wiring pattern whose end portions constitute inner leads connected to the semiconductor chip and terminal connecting portions provided with external connecting terminals, and a resist which is formed on the base film so as to protect the wiring pattern except the terminal connecting portions;

an encapsulation resin which covers the device hole including the semiconductor chip and a part of the resist;

resin stoppers which are formed at the corners of the device hole to prevent the encapsulation resin from excessively flowing out of the device hole toward a back side; and deformation restraining portions which are provided to the resin stoppers to restrain thermal deformation of the resin patterns when heat is applied.

With the deformation restraining portions for restraining thermal deformation of the resin stoppers at a time of heat application, cracking in the resist due to a deformation of the patterns of the resin stoppers can be prevented. More specifically, if the thermal variation of the resin stoppers at the time of heat application is large, stress is caused in the tape-type substrate due to the difference in thermal deformation rate between the resist and the resin stoppers. Integrally formed with the wiring pattern, the resin stoppers are made of metal. Accordingly, the resist is softer than the resin stoppers made of metal, and the stress due to the deformation of the resin stoppers is mainly caused in the resist. Also, the stress tends to concentrate at locations where the variation in sectional area is large. As a result, the stress concentrates particularly at the locations on the resist facing the corners of the device hole.

To solve this problem, the deformation restraining portions are provided to the resin stoppers, so that the stress caused between the patterns of the resin stoppers and the resist can be made smaller. In this manner, cracking at the locations facing the corners of the device hole can be prevented. Thus, the wiring pattern can be prevented from being cut off by a crack, and the reliability of the semiconductor device can be greatly increased.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 4:
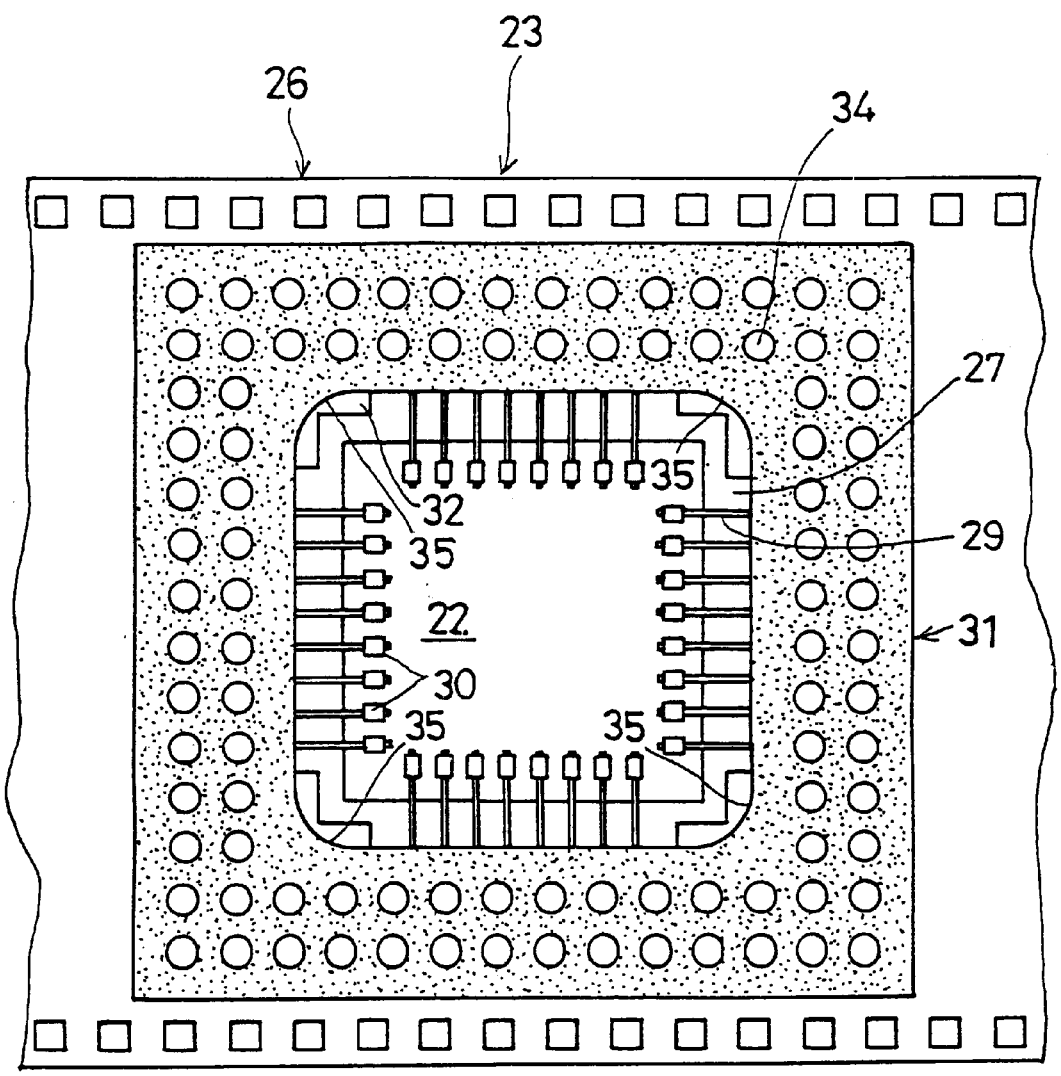
FIG. 4 is a plan view of a semiconductor device of a first embodiment of the present invention.
Figure 5:
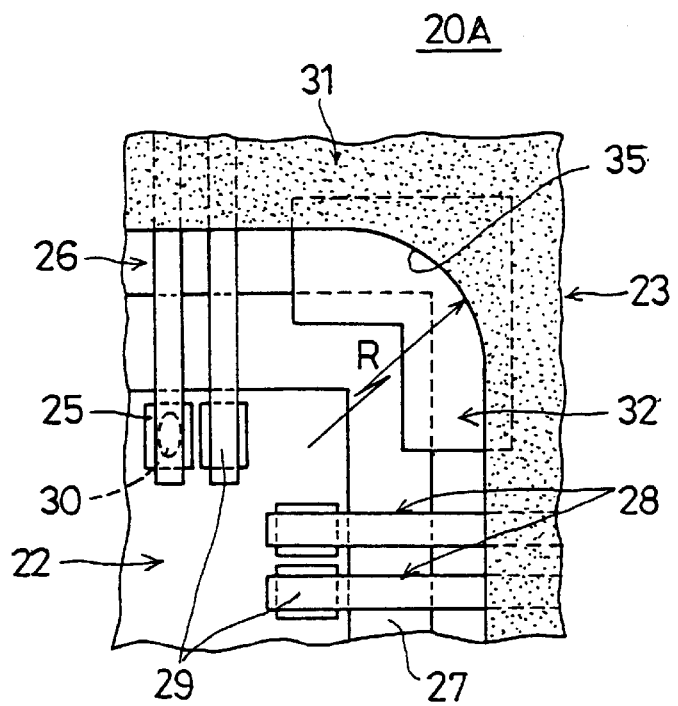
FIG. 5 is an enlarged plan view of a corner of a device hole formed in the semiconductor device of the first embodiment of the present invention.

FIGS. 4 and 5 illustrate a semiconductor device 20A of a first embodiment of the present invention. FIG. 4 is a plan view of the semiconductor device 20A prior to the severance of a TAB tape 23, and FIG. 5 is an enlarged plan view of a corner of a device hole 27 formed in the semiconductor device 20A. It should be understood that the encapsulation resin 4 is employed in the first embodiment and the other embodiments described later, as in the semiconductor device 1 of the prior art. However, the encapsulation resin 4 is not shown in the drawings, for ease of explanation.

The semiconductor device 20A comprises a semiconductor chip 22, the TAB tape 23 (a tape-type substrate), and the encapsulation resin 4 (not shown). Circuits are formed on the upper surface of the semiconductor chip 22, and a plurality of electrodes 25 surround the circuits.

The TAB tape 23 comprises a base film 26, a wiring pattern 28, a photo-solder resist 31, and resin stoppers 32.

The base film 26 is a resin substrate made of polyimide, for instance, and is provided with a square opening that is the device hole 27. The thermal expansion coefficient of the base film 26 is 15 ppm (parts per million), for instance. The wiring pattern having a predetermined pattern is arranged on the base film 26. The wiring pattern 28 is made of copper. The inner end portions of the wiring pattern 28 extend into the device hole 27 and constitute inner leads 29. The outer end portions of the wiring pattern 28 constitute terminal connecting portions provided with solder balls 34 which are to be external connecting terminals.

The semiconductor chip 22 is bonded to the inner leads 29 extending into the device hole 27 by bumps 30, so that the semiconductor chip 22 is electrically connected to the inner leads 29 via the bumps 30, and is fixed within the device hole 27.

The resin stoppers 32 are formed on the base film 26, and located at the four corners of the device hole 27. The resin stoppers 32 are formed at the same time as the formation of the wiring pattern 28, and accordingly are made of copper that is the same material as the wiring pattern 28. With the resin stoppers 32 formed at the four corners of the device hole 27, the encapsulation resin 4 can be prevented from excessively flowing out through the device hole 27 toward the back side.

The photo-solder resist 31 is formed on the base film 26, and surrounds the device hole 27. The photo-solder resist 31 is generally made of an insulating resin, such as epoxy resin, which is harder than the base film 26. The photo-solder resist 31 covers the wiring pattern, thereby protecting the wiring pattern 28. The photo-solder resist 31 also covers a part of each of the resin stoppers 32. Since the photo-solder resist 31 is made of a different resin from the base film 26 to protect the wiring pattern 28 and to maintain the insulation properties, the thermal expansion coefficient of the photo-solder resist 31 differs greatly from the thermal expansion coefficient of the base film 26. More specifically, the thermal expansion coefficient of the base film 26 is 15 ppm, while the thermal expansion coefficient of the photo-solder resist 31 is 140 ppm, for instance.

The photo-solder resist 31 is not formed on the inner leads 29 and the terminal connecting portions provided with solder balls 34, so that the inner leads 29 and the terminal connecting portions are exposed through the photo-solder resist 31. The encapsulation resin 4 covers the device hole 27, so as to protect the semiconductor chip 22 and the inner leads 29.

In this embodiment, a chamfered portion 35 is formed at each corner of the photo-solder resist 31 facing the device hole 17. The chamfered portion 35 has an arc shape having a radius R. Since the photo-solder resist 31 is formed by a screen printing technique, for instance, a mask having a shape corresponding to each chamfered portion 35 is used. Thus, each chamfered portion 35 can be easily formed.

Due to the difference in thermal expansion coefficient between the photo-solder resist 31 and the base film 26, stress is caused in the TAB tape 23 when heat is applied. Also, since the photo-solder resist 31 made of epoxy resin is harder than the base film 26 made of polyimide, the stress is caused mainly on the photo-solder resist 31, and concentrates on the corners of the photo-solder resist 31 facing the device hole 27.

Figure 1:
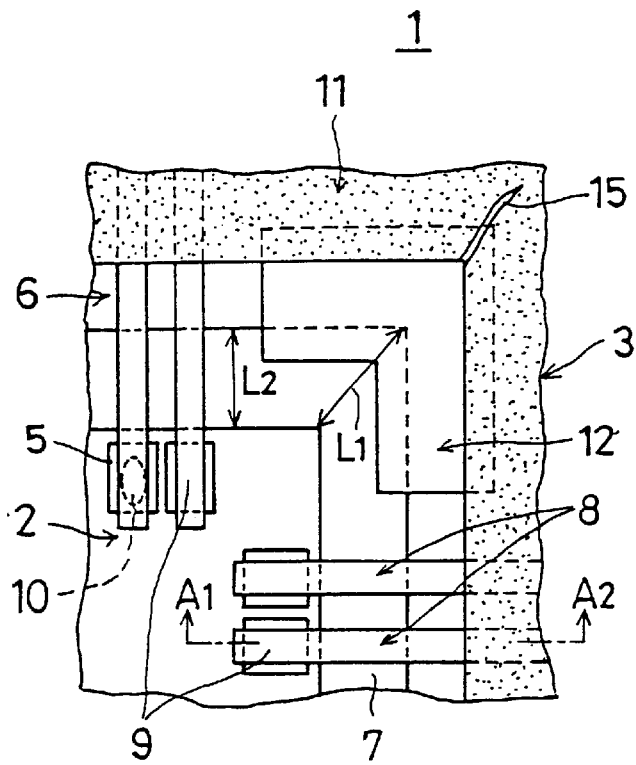
FIG. 1 is an enlarged plan view of a corner of a device hole of a semiconductor device of the prior art.
Figure 2:
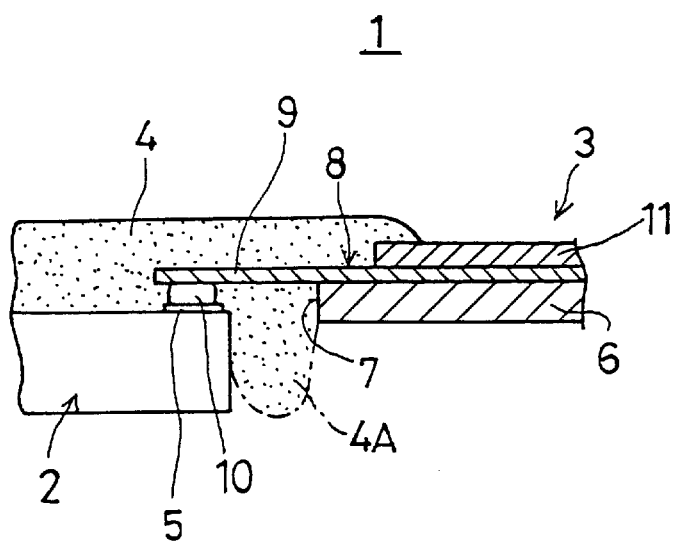
FIG. 2 is a enlarged sectional view of a corner of the device hole of the semiconductor device of the prior art.
Figure 3:
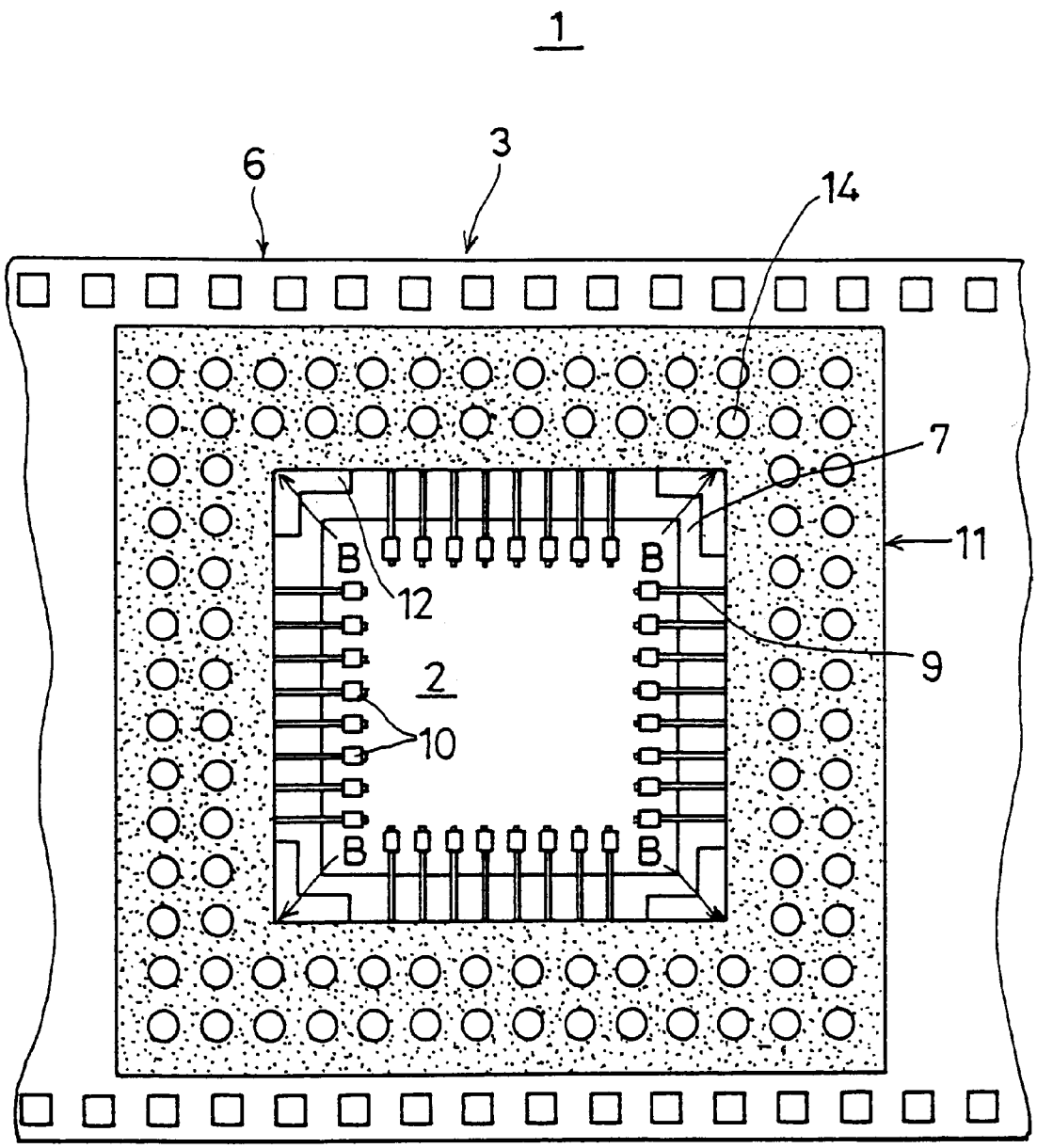
FIG. 3 is a plan view of the semiconductor device prior to the severance of a TAB tape in the prior art.

The chamfered portions 35 on which the stress concentrates are formed at the corners of the photo-solder resist 31 facing the device hole 27. Compared with the angular shape in the prior art shown in FIG. 1, the chamfered portions 35 can absorb the stress caused by large variation in the sectional area at the corners of the photo-solder resist 31 facing the device hole 27, thereby effectively preventing stress concentration. In other words, the chamfered portions 35 function as stress relieving portions which relieve the internal residual stress caused in the photo-solder resist 31.

With the chamfered portions 35 that functions as stress relieving portions for relieving the internal residual stress caused in the photo-solder resist 31, the stress caused by the difference in thermal expansion coefficient between the base film 26 and the photo-solder resist 31 can be prevented from concentrating at the corners. Accordingly, no crack occurs in the photo-solder resist 31, and the wiring pattern 28 is not cut off by a crack. Thus, the reliability of the semiconductor device 20A can be increased.

Also, by increasing the radius R of each of the chamfered portions 35, the variation in sectional area becomes smaller while the stress relieving effect becomes greater. The larger the difference in thermal expansion coefficient between the photo-solder resist 31 and the base film 26, the greater the stress concentration at the corners of the photo-solder resist 31 facing the device hole 27. In view of this, the radius R of each of the chamfered portions 35 is adjusted based on the difference in thermal expansion coefficient between the photo-solder resist 31 and the base film 26, so that the stress concentration can be effectively avoided.

Figure 6:
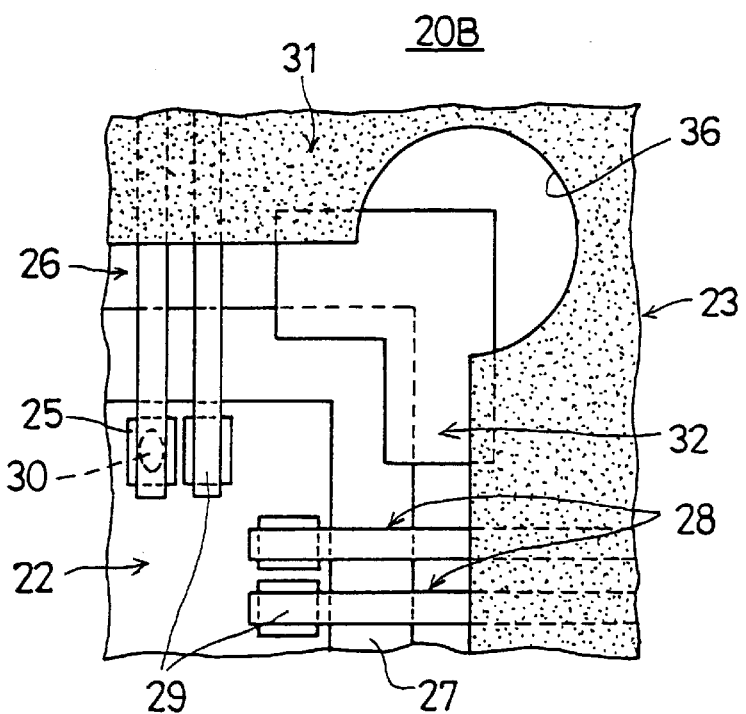
FIG. 6 is an enlarged plan view of a corner of a device hole formed in a semiconductor device of a second embodiment of the present invention.

FIG. 6 shows a semiconductor device 20B of a second embodiment of the present invention. In this figure, the same components as in the semiconductor device 20A of the first embodiment are denoted by the same reference numerals. This also applies to semiconductor devices of the other embodiments described later.

The semiconductor device 20B of this embodiment is characterized by arcuate concave portions 36 formed as stress relieving portions at the locations on the photo-solder resist 31 facing the corners of the device hole 27 (the locations will be hereinafter referred to as corner facing locations).

Figure 7:
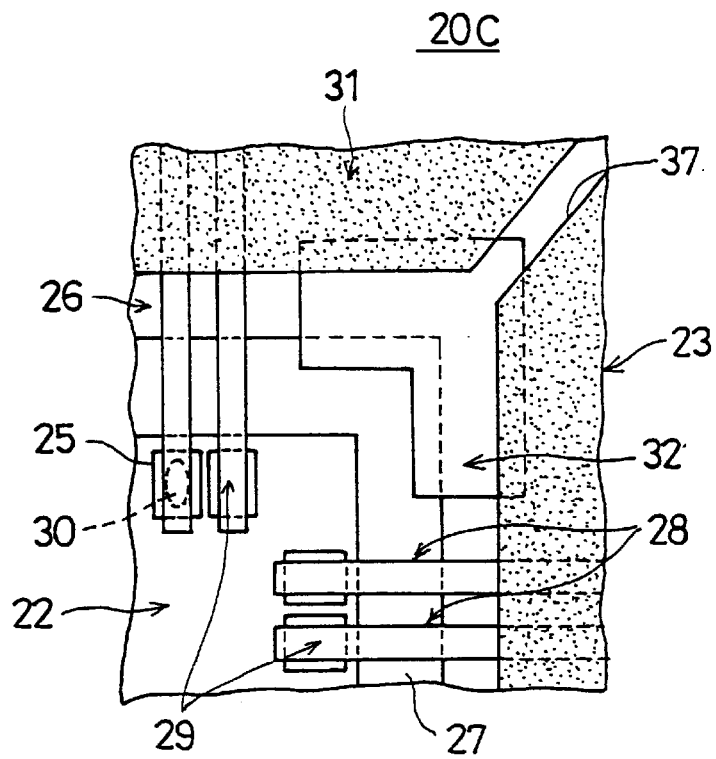
FIG. 7 is an enlarged plan view of a corner of a device hole formed in a semiconductor device of a third embodiment of the present invention.

FIG. 7 shows a semiconductor device 20C of a third embodiment of the present invention. The semiconductor device 20C is characterized by slits 37 each formed as a stress relieving portion at each corresponding corner facing location on the photo-solder resist 31.

Figure 8:
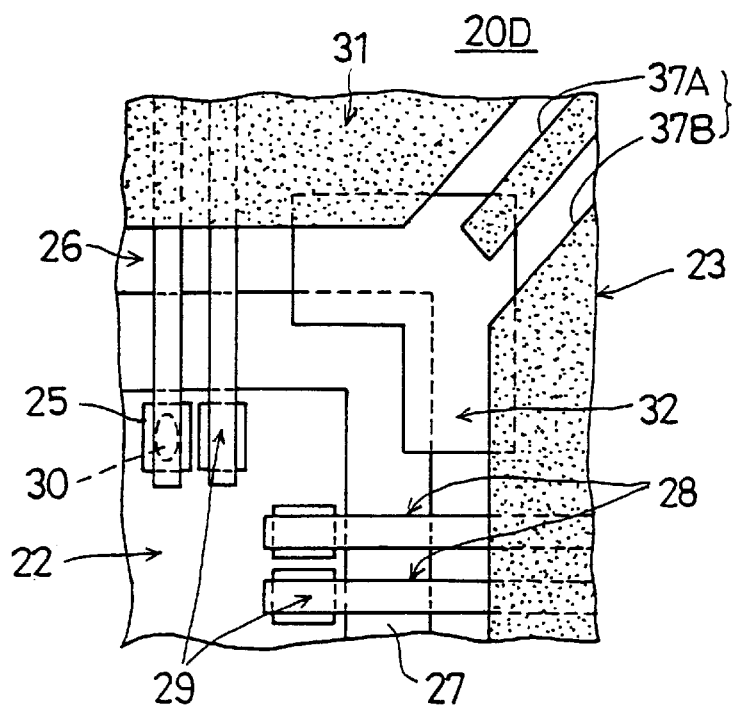
FIG. 8 is an enlarged plan view of a corner of a device hole formed in a semiconductor device of a fourth embodiment of the present invention.

FIG. 8 shows a semiconductor device 20D of a fourth embodiment. The semiconductor device 20D is characterized by a plurality (two in this embodiment) of slits 37A and 37B formed as a stress relieving portion at each of the corner facing locations on the photo-solder resist 31.

As described so far, with the arcuate concave portions 36, the slits 37, or the slits 37A and 37B, the variation in section area at the corner facing locations on the photo-solder resist 31 can be made smaller, and stress concentration can be effectively prevented. Thus, no crack will occur in the photo-solder resist 31 due to the stress concentration, and the reliability of each of the semiconductor devices 20B to 20D can be increased. Since the arcuate concave portions 36, the slits 37, and the slits 37A and 37B are patterned at the same time as the printing of the photo-solder resist 31, they can be easily formed.

Figure 9:
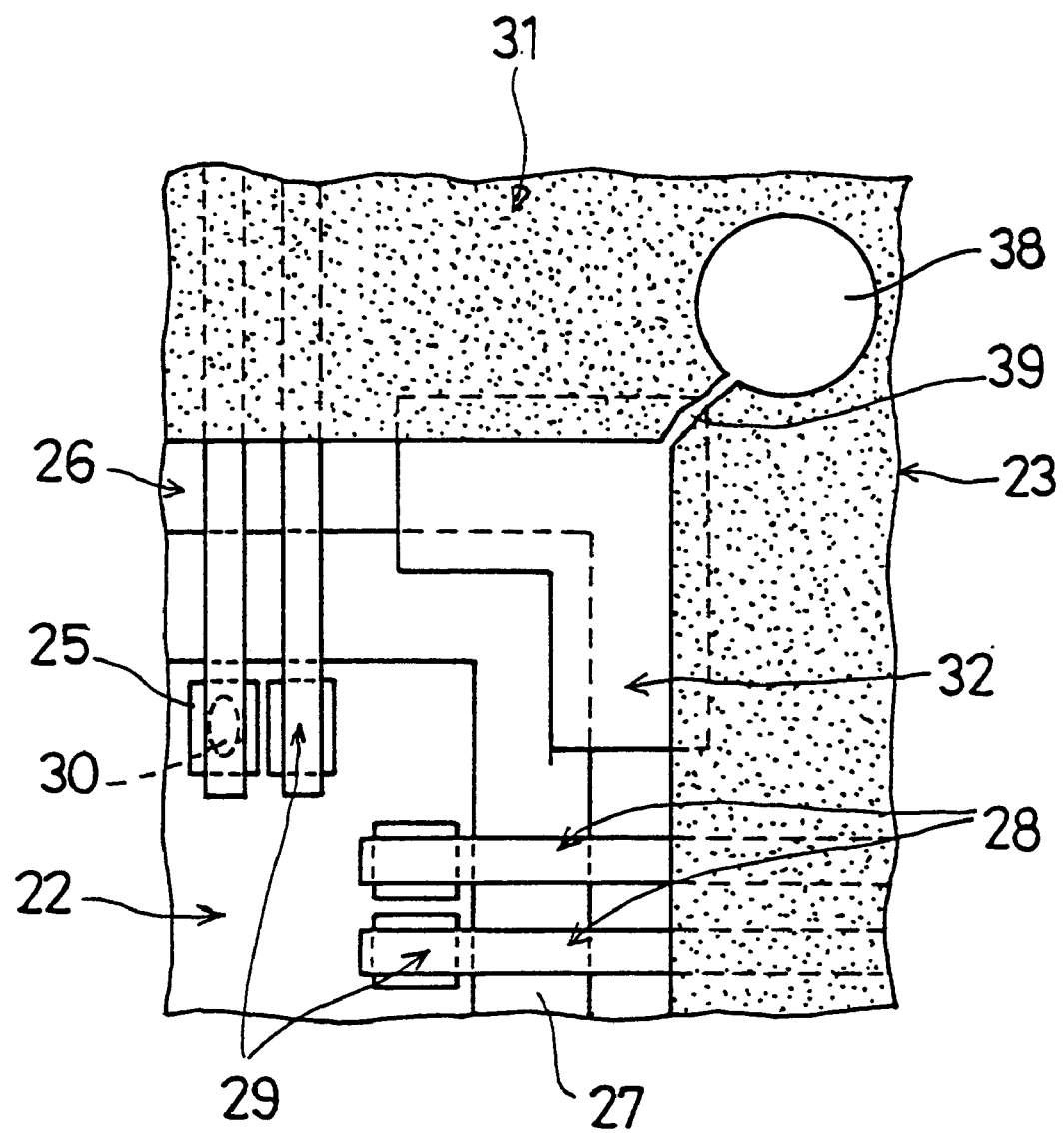
FIG. 9 is an enlarged plan view of a corner of a device hole formed in a semiconductor device of a fifth embodiment of the present invention.

FIG. 9 shows a semiconductor device 20E of a fifth embodiment of the present invention. The semiconductor device 20E is characterized by circular holes 38 each formed as a stress relieving portion at each corresponding corner facing location on the photo-solder resist 31. In this embodiment, each circular hole 38 penetrates only the photo-solder resist 31, not the base film 26 and the wiring pattern 29 situated under the photo-solder resist 31.

Even if a crack 39 occurs at a corner facing location on the photo-solder resist 31 in this embodiment, the crack 3 is stopped from growing larger by the circular hole 38, as shown in FIG. 9. In this manner, the wiring pattern 82 cannot be cut off by a long crack.

Figure 10:
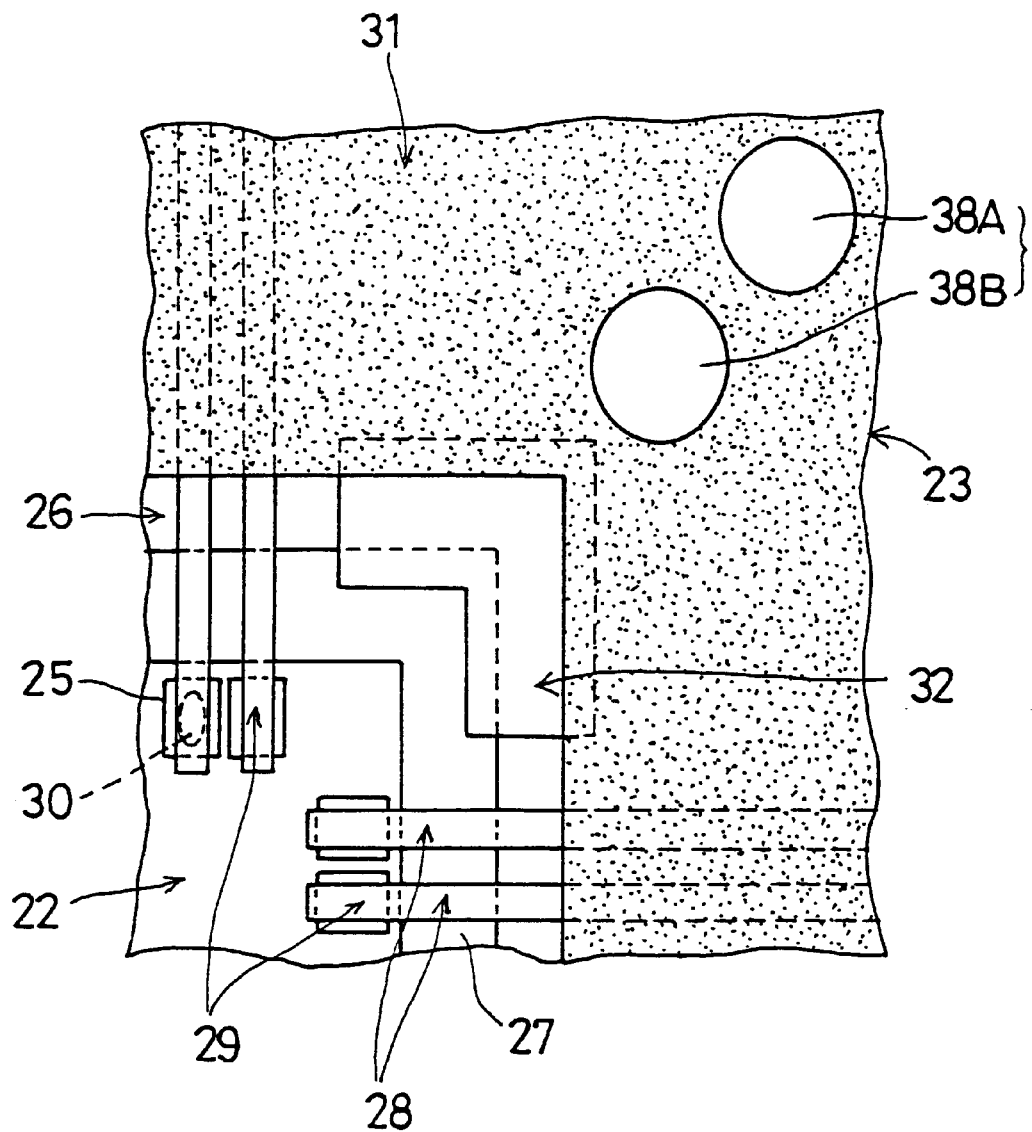
FIG. 10 is an enlarged plan view of a corner of a device hole formed in a semiconductor device of a sixth embodiment of the present invention.

FIG. 10 shows a semiconductor device 20F of a sixth embodiment of the present invention. Unlike the fifth embodiment in which one circuit hole 38 is formed at each of the corner facing locations, the semiconductor device 20E of this embodiment is characterized by a plurality (two in this embodiment) of circular holes 38A and 38B formed at each of the corner facing locations on the photo-solder resist 31.

Even if large stress concentration occurs at a corner facing location on the photo-solder resist 31, and the crack 39 grows beyond the circuit hole 38B, the crack 39 is stopped from growing larger by the circular hole 38A situated in line with the circular hole 38B. Thus, the wiring pattern 28 can be surely prevented from being cut off by a long crack.

Figure 11A:
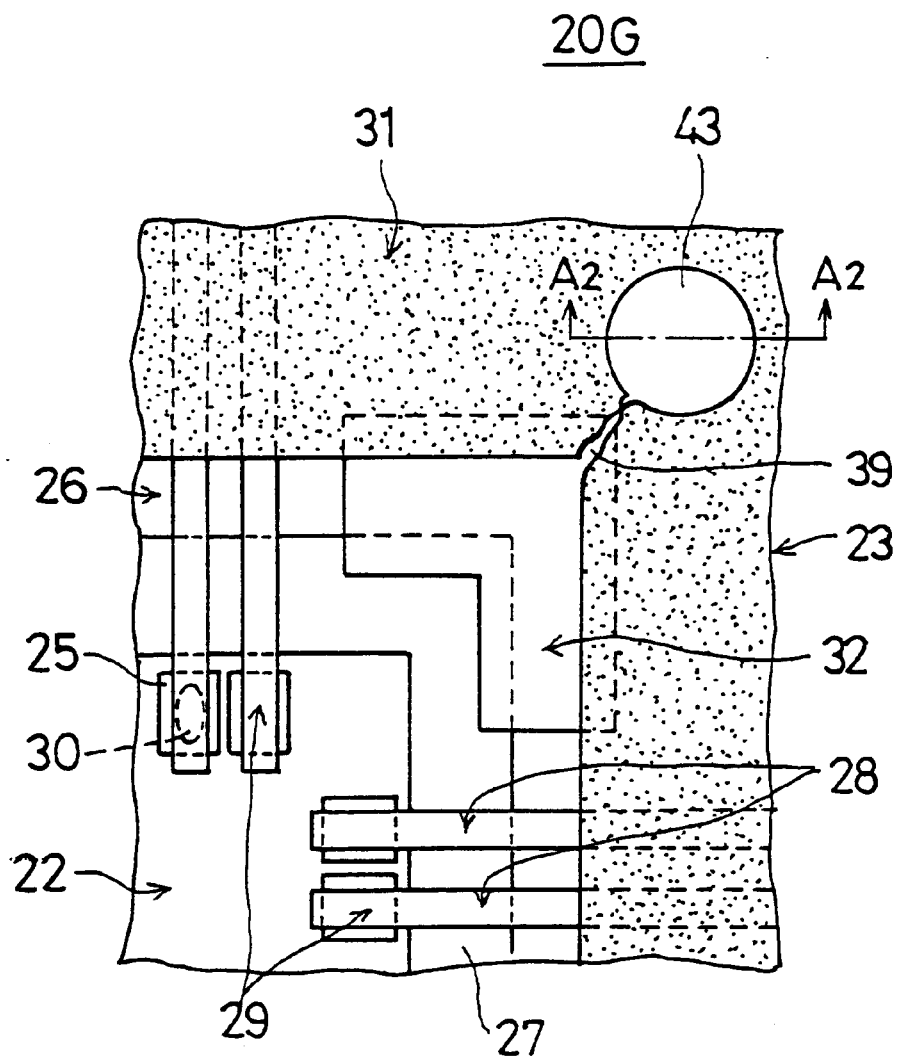
FIGS. 11A and 11B illustrate a corner of a device hole formed in a semiconductor device of a seventh embodiment of the present invention.
Figure 11B:
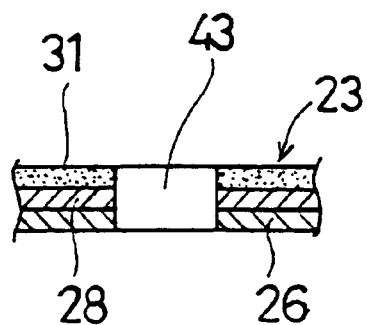
Figure 12A:
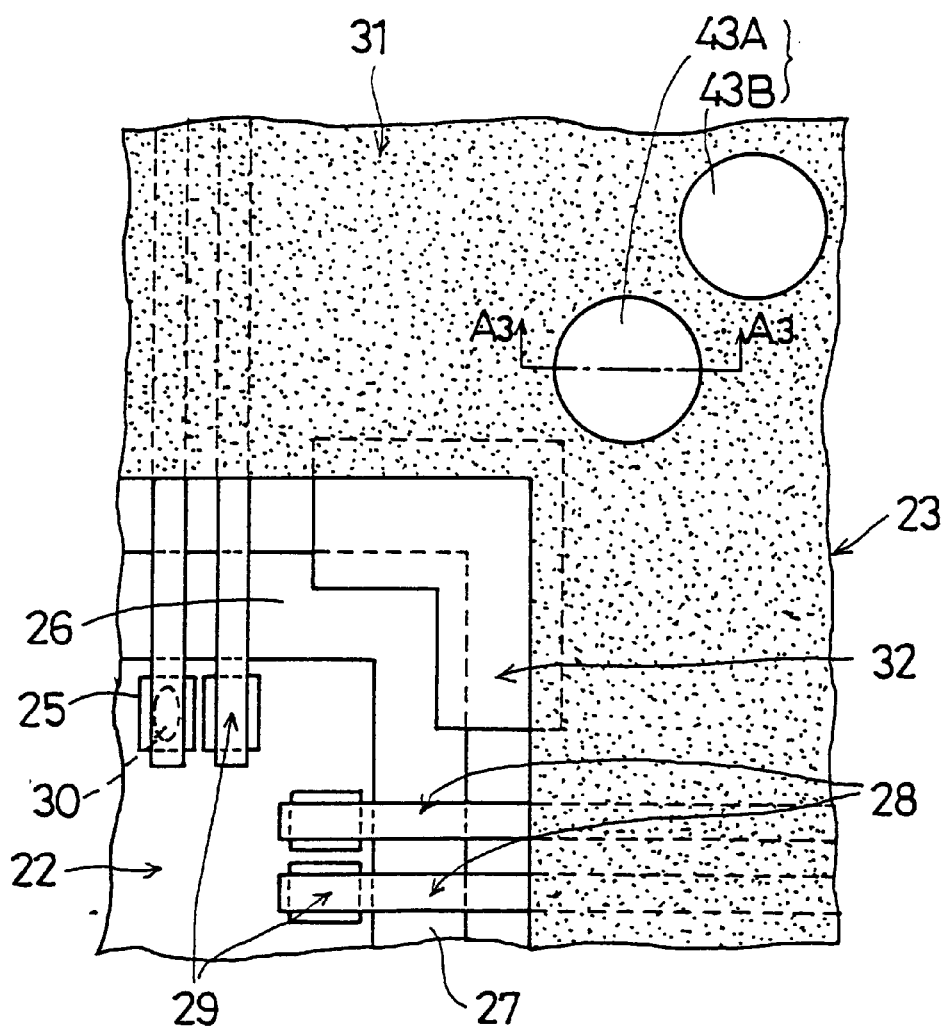
FIGS. 12A and 12B illustrate a corner of a device hole formed in a semiconductor device of an eighth embodiment of the present invention.
Figure 12B:
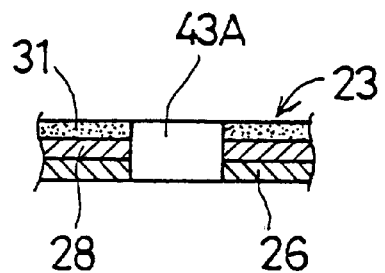

FIGS. 11A and 11B show a semiconductor device 20G of a seventh embodiment of the present invention, and FIGS. 12A and 12B show a semiconductor device 20H of an eighth embodiment of the present invention. More specifically, FIG. 11A is an enlarged plan view of a corner facing location in the semiconductor device 20G, and FIG. 11B is a sectional view of a part of the semiconductor device 20G taken along the line A2—A2 of FIG. 11A. FIG. 12A is an enlarged plan view of a corner facing location in the semiconductor device 20H, and FIG. 12B is a sectional view of a part of the semiconductor device 20H taken along the line A3—A3 of FIG. 12A.

In the semiconductor devices 20E and 20F shown in FIGS. 9 and 10, respectively, each of the circular holes 38, 38A and 38B penetrates only the photo-solder resist 31. The semiconductor devices 20H and 20G of the seventh and eighth embodiments, however, are provided with penetration holes 43, 43A, and 43B which penetrate not only the photo-solder resist 31 but also the base film 26 and the wiring pattern 28. The crack 39 can be prevented from growing larger when it reaches any of the penetration holes 43, 43A, and 43B.

With the penetration holes 43, 43A, and 43B vertically penetrating the TAB tape 23, the crack 39 can be surely prevented from growing larger when it reaches any of the penetration holes 43, 43A, and 43B. Accordingly, compared with the semiconductor devices 20E and 20F of the fifth and sixth embodiments shown in FIGS. 9 and 10, the wiring pattern 28 can be more reliably prevented from being cut off by a long crack in the seventh and eighth embodiments.

Figure 13:
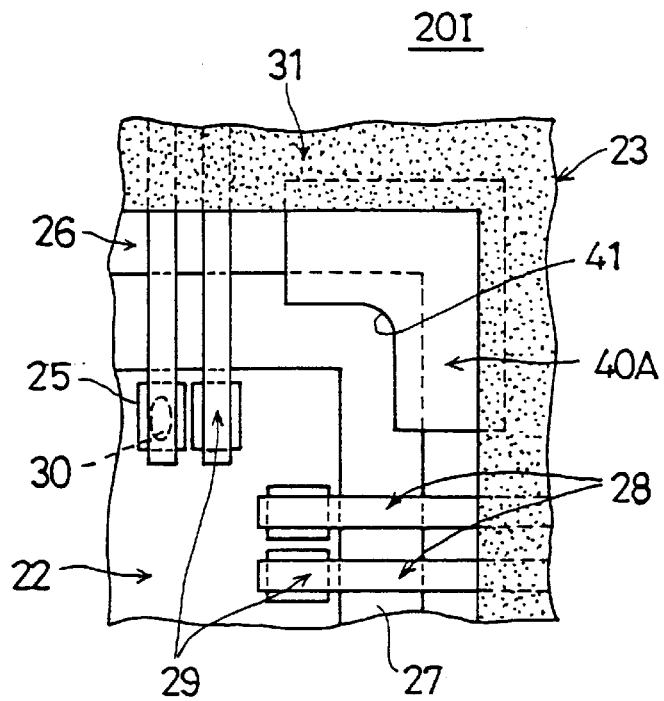
FIG. 13 is an enlarged plan view of a corner of a device hole formed in a semiconductor device of a ninth embodiment of the present invention.

FIG. 13 shows a semiconductor device 20I of a ninth embodiment of the present invention. The semiconductor device 20I is characterized by chamfered portions 41 each formed at the corner facing location on each corresponding resin stopper 40A. The chamfered portions 41 are used as deformation restraining portions for restraining thermal deformation of the resin stoppers 40A at a time of heat application. With the chamfered portions 41 at the resin stoppers 40A, cracking in the photo-solder resist 31 due to deformation of the resin stoppers 40A can be prevented.

More specifically, if the thermal variation of the resin stoppers 40A is large at the time of heat application, stress is caused in the TAB tape 23 due to the difference in thermal deformation rate between the photo-solder resist 31 and the resin stoppers 40A. Here, the resin stoppers 40A are made of copper, as is the wiring pattern 28.

Since the photo-solder resist 31 made of resin is softer than the resin stoppers 40A made of metal, the stress caused due to deformation of the resin stoppers 40A concentrates in the photo-solder resist 31. Also, the stress tends to concentrate at locations with large variations in sectional area is large. As a result, the stress concentrates particularly at corners of the photo-solder resist 31.

To solve this problem, the chamfered portions 41 are formed at locations on the resin patterns facing the corners of the photo-solder resist 31, so that the stress caused between the photo-solder resist 31 and the resin stoppers can be made smaller. In this manner, cracking at the corner facing locations where the stress concentrates can be prevented, and the wiring pattern can be prevented from being cut off by a crack. Thus, the reliability of the semiconductor device 20I can be greatly increased.

Figure 14:
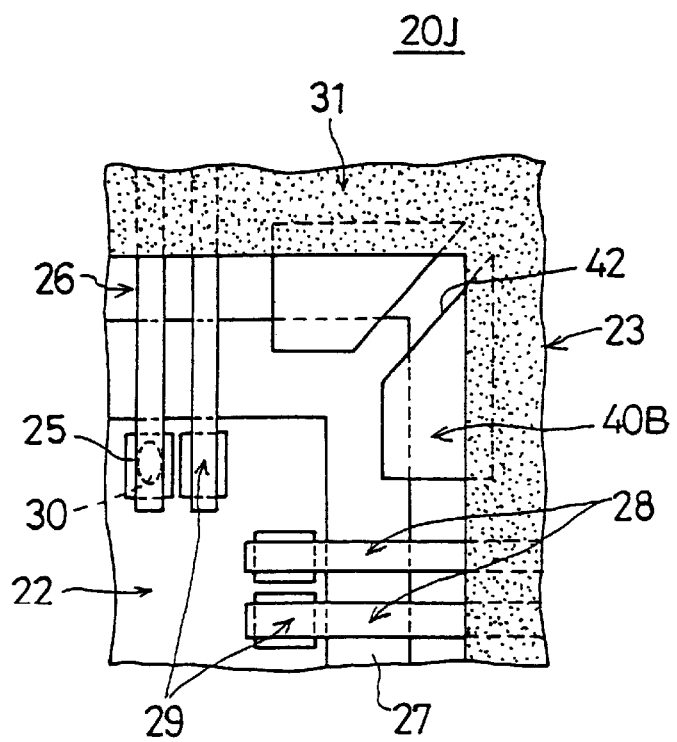
FIG. 14 is an enlarged plan view of a corner of a device hole formed in a semiconductor device of a tenth embodiment of the present invention.
Figure 15:
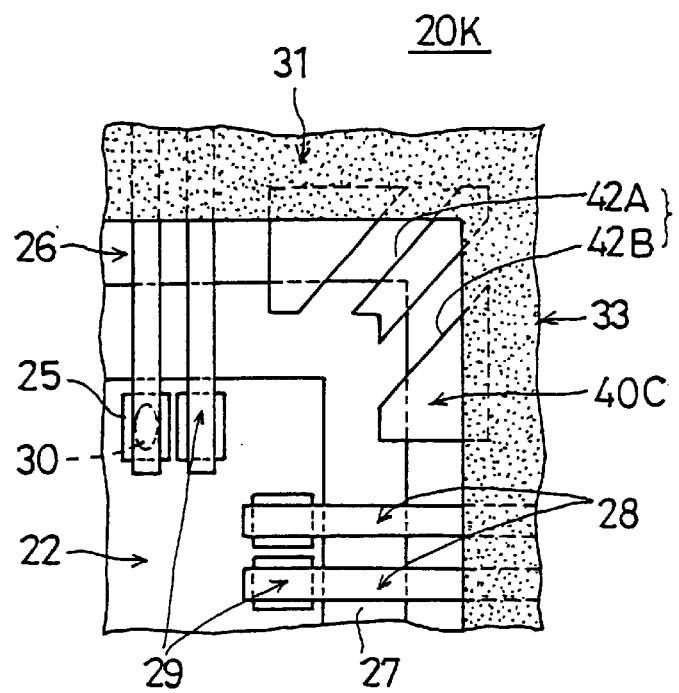
FIG. 15 is an enlarged plan view of a corner of a device hole formed in a semiconductor device of an eleventh embodiment of the present invention.

FIG. 14 shows a semiconductor device 20J of a tenth embodiment of the present invention. The semiconductor device 20J is characterized by slits 42 each formed at the corner facing location of each corresponding resin stopper 40B. FIG. 15 shows a semiconductor device 20K of an eleventh embodiment of the present invention. The semiconductor device 20K is characterized by slits 42A and 42B formed at the corner facing locations on resin stoppers 40C.

With the slits 42, and the slits 42A and 42B formed as deformation restraining portions at the corner facing locations on the resin stoppers 40B and 40C, respectively, the deformation at the corner facing locations on the resin stoppers 40B and 40C can be reduced, and stress concentration can be effectively prevented.

As in the semiconductor device 20I of the ninth embodiment, cracking in the photo-solder resist 31 due to stress concentration can be avoided, and the wiring pattern 28 can be prevented from being cut off by a crack. Thus, the reliability of each of the semiconductor devices 20J and 20K can be increased. Also, the chamfered portions 41, the slits 42, and the slits 42A and 42B can be collectively formed at the time of patterning the wiring pattern 28 by an etching technique, for instance. Accordingly, those deformation restraining portions do not complicate the production procedures.

Figure 16:
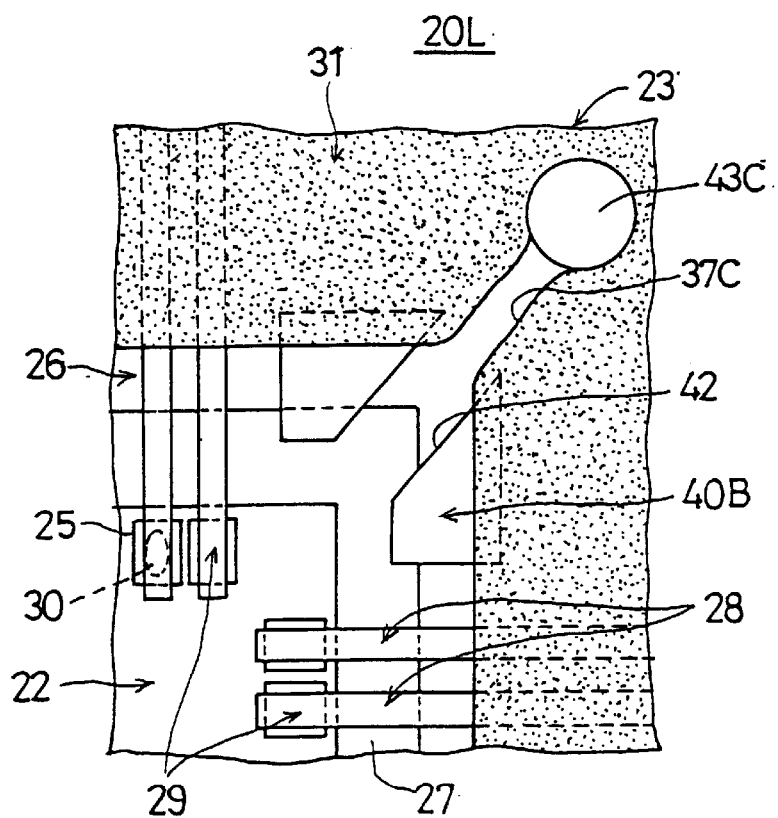
FIG. 16 is an enlarged plan view of a corner of a device hole formed in a semiconductor device of a twelfth embodiment of the present invention.

FIG. 16 shows a semiconductor device 20L of a twelfth embodiment of the present invention. The semiconductor device 20L is characterized by the slits 37C the same as in the third embodiment (shown in FIG. 7) each formed at each corresponding corner facing location on the photo-solder resist 31, the through holes 43C same as in the seventh embodiment (shown in FIG. 11A) each formed at each corresponding corner facing location on the photo-solder resist 31, and the slits 42 same as in the tenth embodiment (shown in FIG. 14) each formed at each corresponding corner facing location on the resin stoppers 40B.

As in this embodiment, it is possible to employ any suitable combination of the chamfered portions 35 or 41, the arcuate concave portions 36, the slits 37, 37A and 37B, 42, or 42A and 42B, the circular holes 38 or 38A and 38B, and the through holes 43 or 43A and 43B. Thus, cracking in photo-solder resist 31 and cutoff in the wiring pattern 28 can be surely prevented.

The present invention is not limited to the specifically disclosed embodiments, but variations and modifications may be made without departing from the scope of the present invention.

The present application is based on Japanese priority application No. 11-109930, filed on Apr. 16, 1999, the entire contents of which are hereby incorporated by reference.

What is claimed is:

1. A semiconductor device comprising:

a semiconductor chip;

a tape-type substrate which has a base film having a first thermal expansion coefficient provided with a device hole formed in a location where the semiconductor chip is mounted, a wiring pattern whose end portions constitute inner leads connected to the semiconductor chip and terminal connecting portions provided with external connecting terminals, and a resist which has a second thermal expansion coefficient different from that of the base film and is formed on the base film so as to protect the wiring pattern except the terminal connecting portions;

an encapsulation resin which covers the device hole including the semiconductor chip and a part of the resist;

resin stoppers at the corners of the device hole; and stress relieving portions which are formed in the resist at locations on the resist facing the corners of the device hole, over said resin stoppers, so as to relieve internal residual stress caused in the resist.

2. The semiconductor device as claimed in claim 1, wherein each of the stress relieving portions is a chamfered portion formed at each of the locations on the resist facing the corners of the device hole.

3. The semiconductor device as claimed in claim 1, wherein each of the stress relieving portions is an arcuate concave portion formed at each of the locations on the resist facing the corners of the device hole.

4. The semiconductor device as claimed in claim 1, wherein each of the stress relieving portions is one or more slits formed at each of the locations on the resist facing the corners of the device hole.

5. The semiconductor device as claimed in claim 1, wherein the resist is constituted by a photo-solder resist.

6. A semiconductor device comprising:

a semiconductor chip;

a tape-type substrate which has a base film provided with a device hole formed in a location where the semiconductor chip is mounted, a wiring pattern whose end portions constitute inner leads connected to the semiconductor chip and terminal connecting portions provided with external connecting terminals, and a resist which has a second thermal expansion coefficient different from that of the base film and is formed on the base film so as to protect the wiring pattern except the terminal connecting portions;

an encapsulation resin which covers the device hole including the semiconductor chip and a part of the resist; and stress relieving portions which are formed at locations on the resist facing the corners of the device hole, so as to relieve internal residual stress caused in the resist, each of the stress relieving portions being one or more penetration holes which penetrate at least the resist and are formed at each of the locations on the resist facing the corners of the device hole.

7. A semiconductor device comprising:

a semiconductor chip;

a tape-type substrate which has a base film provided with a device hole formed in a location where the semiconductor chip is mounted, a wiring pattern whose end portions constitute inner leads connected to the semiconductor chip and terminal connecting portions provided with external connecting terminals, and a resist which is formed on the base film except the terminal connecting portions so as to protect the wiring pattern;

an encapsulation resin which covers the device hole including the semiconductor chip and a part of the resist;

resin stoppers which are formed at the corners of the device hole to prevent the encapsulation resin from excessively flowing out of the device hole toward a back side; and deformation restraining portions which are provided to the resin stoppers to restrain thermal deformation of the resin patterns when heat is applied.

8. The semiconductor device as claimed in claim 7, wherein each of the deformation restraining portions is a chamfered portion formed at a location on each of the resin stoppers facing the corners of the device hole.

9. The semiconductor device as claimed in claim 7, wherein each of the deformation restraining portions is an arcuate concave portion formed at a location on each of the resin stoppers facing the corners of the device hole.

10. The semiconductor device as claimed in claim 7, wherein each of the deformation restraining portions is one or more slits formed at a location on each of the resin stoppers facing the corners of the device hole.

11. The semiconductor device as claimed in claim 7, wherein each of the deformation restraining portions is one or more penetration holes which penetrate at least the resist and are formed at a location on each of the resin stoppers facing the corners of the device hole.

12. The semiconductor device as claimed in claim 7, wherein the resist is constituted by a photo-solder resist.

* * * * *